United States Patent
Oida et al.

[19]

[11] Patent Number: 6,126,885
[45] Date of Patent: Oct. 3, 2000

[54] METHOD FOR MANUFACTURING RESIN-MOLDED SEMICONDUCTOR DEVICE

[75] Inventors: Seishi Oida, Kyoto; Yukio Yamaguchi, Shiga; Nobuhiro Suematsu, Kyoto; Takeshi Morikawa, Shiga; Yuichiro Yamada, Kyoto, all of Japan

[73] Assignee: Matsushita Electronics Corporation, Osaka, Japan

[21] Appl. No.: 09/105,211

[22] Filed: Jun. 26, 1998

[30] Foreign Application Priority Data

Jun. 27, 1997 [JP] Japan ................................. 9-171396

[51] Int. Cl.⁷ ............................. B29C 33/18; B29C 70/70
[52] U.S. Cl. ........................ 264/511; 264/272.17; 264/276
[58] Field of Search .................... 264/272.11, 272.15, 264/272.17, 276, 511, 272.14, 266; 425/116, 117, 121, 543, 544, 546

[56] References Cited

U.S. PATENT DOCUMENTS

| | | | |
|---|---|---|---|
| 4,975,765 | 12/1990 | Ackermann et al. | 357/80 |
| 4,994,224 | 2/1991 | Itoh et al. | 264/511 |
| 5,000,903 | 3/1991 | Matzinger et al. | 264/266 |
| 5,218,759 | 6/1993 | Juskey et al. | 264/272.17 |
| 5,674,343 | 10/1997 | Hotta et al. | 264/272.17 |
| 5,824,252 | 10/1998 | Miyajima | 264/272.17 |
| 5,846,477 | 12/1998 | Hotta et al. | 264/511 |

FOREIGN PATENT DOCUMENTS

| | | |
|---|---|---|
| 52-067966 | 6/1977 | Japan . |
| 57-084157 | 5/1982 | Japan . |
| 57-176751 | 10/1982 | Japan . |
| 02122555 | 5/1990 | Japan . |
| 02134832 | 5/1990 | Japan . |
| 2-133943 | 5/1990 | Japan . |
| 02209739 | 8/1990 | Japan . |
| 03094459 | 4/1991 | Japan . |
| 03240260 | 10/1991 | Japan . |
| 04337657 | 11/1992 | Japan . |
| 05047954 | 2/1993 | Japan . |

*Primary Examiner*—Angela Ortiz
*Attorney, Agent, or Firm*—McDermott, Will & Emery

[57] ABSTRACT

According to the present invention, a method for manufacturing a resin-molded semiconductor device by interposing a sealing sheet within a molding die for encapsulating a lead frame, on which a semiconductor chip has been bonded, with a molding compound, is provided. In adhering the sealing sheet to the lead frame and encapsulating the lead frame with the molding compound, tension is applied to the sealing sheet.

2 Claims, 4 Drawing Sheets

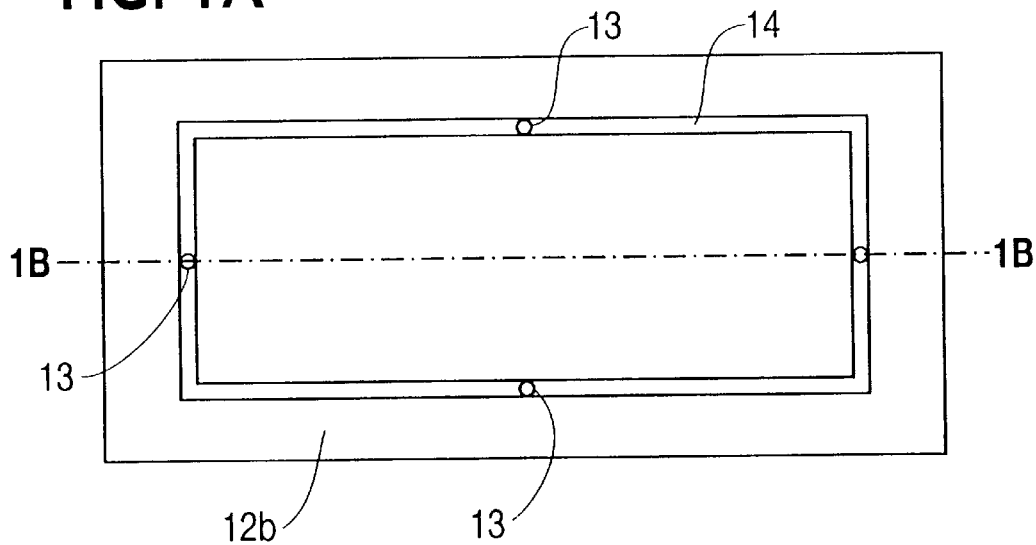
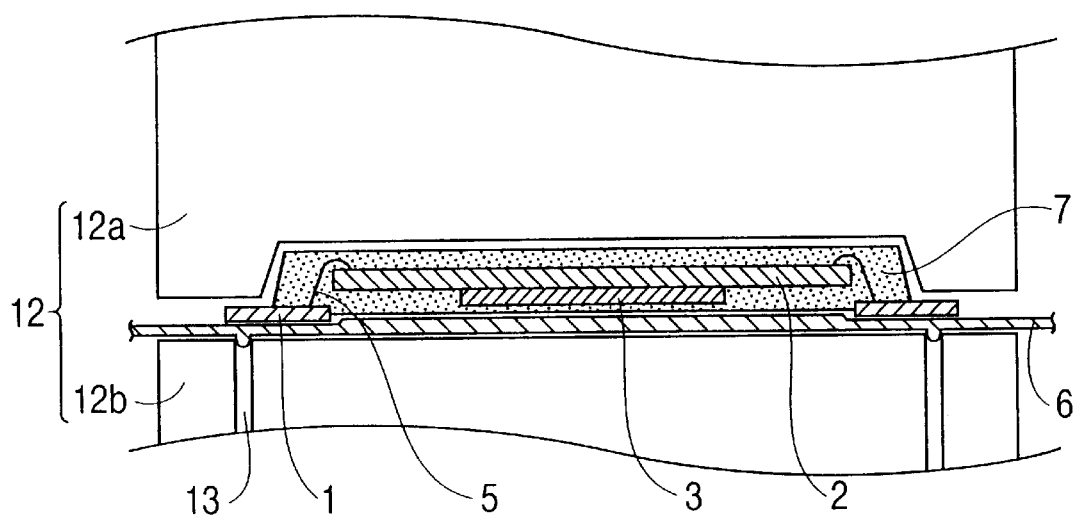

METHOD FOR MANUFACTURING RESIN-MOLDED SEMICONDUCTOR DEVICE

BACKGROUND OF THE INVENTION

The present invention relates to a method for manufacturing a resin-molded semiconductor device with external electrodes exposed on the bottom surface thereof by encapsulating the outer periphery of the lead frame thereof (in particular, the periphery of the surface thereof on which a semiconductor chip is mounted), with a molding compound.

In recent years, in order to catch up with rapidly advancing downsizing of electronic apparatuses, it has become increasingly necessary to mount semiconductor components like semiconductor chips or pellets with higher and higher density. Correspondingly, sizes and thicknesses of semiconductor devices have also been noticeably reduced.

Hereinafter, a method for manufacturing a resin-molded semiconductor device of the type suitably applicable to downsizing and reducing the thickness of semiconductor devices and the structure of a molding die usable therefor will be described.

A PCT International Application filed on Feb. 4, 1998 (PCT/JP98/00476; priority date: Feb. 10, 1997) discloses a novel method for manufacturing a resin-molded semiconductor device or a plastic package. The contents of the above-identified application are incorporated herein by reference.

The method for manufacturing a resin-molded semiconductor device disclosed in the above-identified application will be described below with reference to FIGS. 3 through 9.

First, as shown in FIG. 3, a lead frame 4, including at least an inner lead portion 1 and a die pad portion 3 for supporting a semiconductor chip 2 surrounded by the inner lead portion 1, is prepared. It is noted that the die pad portion 3 is actually supported by a support lead portion (not shown). Depressed portions (not shown, either) are formed in the support lead portion and the die pad portion 3 is up set above the plane on which the inner lead portion 1 is located. The lead frame 4 does not include any tie bar used for preventing a molding compound supplied from flowing out during resin molding. It is also noted that the die pad portion 3 has a smaller surface area than that of the semiconductor chip 2 to be bonded thereon.

Next, as shown in FIG. 4, the semiconductor chip 2 is bonded onto the die pad portion 3 of the lead frame 4 using an adhesive. This process step is called "die bonding".

Then, as shown in FIG. 5, the semiconductor chip 2, which has been bonded onto the die pad portion 3, is electrically bonded to the inner lead portion 1 via metal fine wires 5. This process step is called "wire bonding".

Subsequently, as shown in FIG. 6, a sealing sheet (or sealing tape) 6 is attached to the bottom face of the lead frame 4 in which the semiconductor chip 2 has been bonded onto the die pad portion 3. This sealing sheet 6 is attached particularly for the purposes of providing a stopper preventing the molding compound from reaching the bottom face of the inner lead portion 1 during resin molding and of preventing any resin burr from being formed on the bottom face of the inner lead portion 1. The sealing sheet 6 is attached to cover the entire bottom face of the lead frame 4. However, the sheet 6 is adhered only to the bottom face of the inner lead portion 1, not to that of the die pad portion 3 that has been up set via the depressed portions of the support lead portion.

Thereafter, as shown in FIG. 7, the lead frame 4, to which the semiconductor chip 2 has been bonded and the sealing sheet 6 has been attached, is encapsulated with a molding compound 7. In this case, the lead frame 4 is placed within a molding die (not shown) and transfer-molded. Resin molding is performed in such a manner as to make the upper half of the molding die (i.e., upper mold) press the extended portion 8 at the ends of the inner lead portion 1 of the lead frame 4 so that the molding compound 7 does not reach the bottom face of the inner lead portion 1. Also, resin molding is performed in such a manner as to press the bottom face of the sealing sheet 6 on the inner lead portion 1 to the lower half (i.e., the lower mold) of the molding die. During resin molding, heat is generated. Because of the heat, the sealing sheet 6, attached to the bottom face of the inner lead portion 1, is thermally shrunk. As a result, a part of the sheet 6 forces its way inward (i.e., pushes its way through the supplied resin) to reach a level higher than the original level by the thickness thereof. In other words, the ingrown part of the sheet 6 doubles in thickness. Consequently, steps 9 are formed in the molding compound 7 around the bottom face of the inner lead portion 1. That is to say, the bottom face of the inner lead portion 1 protrudes from the bottom face of the molding compound 7, and therefore the inner lead portion 1 can secure a desired stand-off height. Thus, the protruding inner lead portion 1 may be used as external electrodes as it is.

Then, the sealing sheet 6 attached to the bottom face of the inner lead portion 1 is peeled off, thereby completing the inner lead portion 1 protruding from the bottom face of the molding compound 7. Finally, the extended portion 8 at the ends of the inner lead portion 1 of the lead frame 4 are cut off the lead frame 4, thereby making the end faces of the inner lead portion 1 substantially flush with the side faces of the molding compound 7 and forming external electrodes 10. In this manner, a resin-molded semiconductor device such as that shown in FIG. 8 is completed.

Next, the structure of a resin molding die used in the method for manufacturing a resin-molded semiconductor device will be described with reference to FIG. 9. FIG. 9 is a cross-sectional view illustrating a resin molding die for the resin-molded semiconductor device.

As shown in FIG. 9, the molding die 11 includes an upper mold 11a and a lower mold 11b. The upper surface of the lower mold 11b is flat. By utilizing these molds, the sealing sheet 6, to be adhered to the bottom face of the lead frame 4 in which the semiconductor chip 2 has been bonded onto the die pad portion 3, forces its way inward owing to heat shrinkage so as to partially cover the side faces of the inner lead portion 1. As a result, the external electrodes 10 are formed to protrude from the bottom face of the molding compound 7.

However, the present inventors found that in the method for manufacturing a resin-molded semiconductor device, if the sealing sheet is thin, then some wrinkles are formed on the sealing sheet during resin molding. This is because such a sealing sheet is likely to thermally shrink to a large degree or tends to greatly expand and sag because of the heat applied. As a result, we found, the pattern of the wrinkles may be transferred as it is to the resin exposed on the reverse surface of the resin-molded semiconductor device and some unevenness may be formed on the reverse surface.

The present inventors also found that, on the other hand, if the sealing sheet is thick, then the thermally shrunk sealing sheet forces its way inward deeper, thereby covering a larger area of the side faces of the inner lead portion to be external electrodes and forming a deep groove in the reverse surface of the resin-molded semiconductor device. As a result, we found that the contact area between the molding compound and the side faces of the inner lead portion may be decreased and the adhesion strength of the compound to the inner lead portion may be weakened.

SUMMARY OF THE INVENTION

In view of these problems caused in accordance with the thickness of the sealing sheet, an object of the present invention is to provide a method for manufacturing a resinmolded semiconductor device that can always prevent heat shrinkage from generating wrinkles on the sealing sheet irrespective of the thickness of the sheet and can control the depth of the groove formed around the side faces of the inner lead portion of the resin-molded semiconductor device, i.e., the amount of the sealing sheet which is thermally shrunk to force its way inward on the side faces of the inner lead portion during resin molding.

In order to solve the problems, the present invention provides an improved method for manufacturing a resin-molded semiconductor device that is principally characterized by the technique of encapsulating the surface of a lead frame, on which a semiconductor chip is bonded, with a molding compound.

According to the present invention, a method for manufacturing a resin-molded semiconductor device is provided. In the semiconductor device, a lead frame bonded with a semiconductor chip is encapsulated with a molding compound by interposing a sealing sheet within a molding die. In adhering the sealing sheet to the lead frame and encapsulating the lead frame with the molding compound, tension is applied to the sealing sheet.

Specifically, in one embodiment of the present invention, the sealing sheet is caused to stick to the molding die by a plurality of vacuum suction devices, which are formed in the molding die at substantially regular intervals, thereby equally applying tension to the sheet and encapsulating the lead frame with the molding compound.

According to another method for manufacturing a resin-molded semiconductor device of the present invention, parts of the sealing sheet, which come into contact with an inner lead portion of the lead frame, are allowed to fill in respective concave portions formed in the molding die, thereby adhering the sealing sheet to the lead frame and encapsulating the lead frame with the resin.

Specifically, in another embodiment of the present invention, a molding die, including concave portions at respective parts that come into contact with the sealing sheet, is used in adhering the sealing sheet to an inner lead portion of the lead frame. In encapsulating the lead frame with the molding compound, the parts of the sealing sheet, which come into contact with the inner lead portion, are allowed to fill in the respective concave portions. Also, the vacuum suction devices and the concave portions may be used in combination.

As described above, by causing the sealing sheet to stick to the molding die and encapsulating the lead frame with a molding compound while equally applying tension to the sealing sheet, it is possible to prevent heat shrinkage from generating wrinkles on the sealing sheet during resin molding. As a result, in a resin-molded semiconductor device, the surface of the exposed molding compound can be flattened on the reverse surface thereof. In addition, during resin molding, if a molding die including concave portions is used, then parts of the sealing sheet are allowed to fill in the concave portions. As a result, the areas of the side faces of the inner lead portion that are covered by the sealing sheet forcing its way inward because of heat shrinkage can be reduced. That is to say, the depth of the groove formed around the side faces of the inner lead portion can be reduced. Consequently, the adhesion areas between the side faces of the inner lead portion and the molding compound can be increased and therefore the adhesion strength of the molding compound to the inner lead portion can be increased. Furthermore, even if the vacuum suction devices and the concave portions are used in combination, it is still possible to prevent wrinkles from being formed on the sealing sheet. And it is also possible to prevent a deep groove from being formed because of ingrowing of the sealing sheet on the side faces of the lead frame.

A still another method for manufacturing a resin-molded semiconductor device of the present invention includes the steps of: preparing a molding die, a semiconductor chip and a peripheral member; attaching a sealing sheet to the molding die while adhering the sealing sheet to a part of one surface of the peripheral member; and encapsulating at least parts of the semiconductor chip and the peripheral member, other than the part of the surface, with a molding compound, while applying tension to the sealing sheet and attaching the sealing sheet to the molding die.

A yet another method for manufacturing a resin-molded semiconductor device of the present invention includes the steps of: preparing a molding die having concave portions, a semiconductor chip and a peripheral member; attaching a sealing sheet to the molding die while adhering the sealing sheet to a part of one surface of the peripheral member; and encapsulating at least parts of the semiconductor chip and the peripheral member, other than the part of the surface, with a molding compound, while attaching the sealing sheet to the molding die. The encapsulating step is performed while allowing parts of the sealing sheet, which come into contact with an inner lead portion of the peripheral member, to fill in the concave portions of the molding die.

BRIEF DESCRIPTION OF THE DRAWINGS

FIGS. 1A and 1B are respectively plan view and cross-sectional view illustrating a method for manufacturing a resin-molded semiconductor device in the first embodiment of the present invention.

DETAILED DESCRIPTION OF THE PREFERRED EMBODIMENTS

Figure 2:
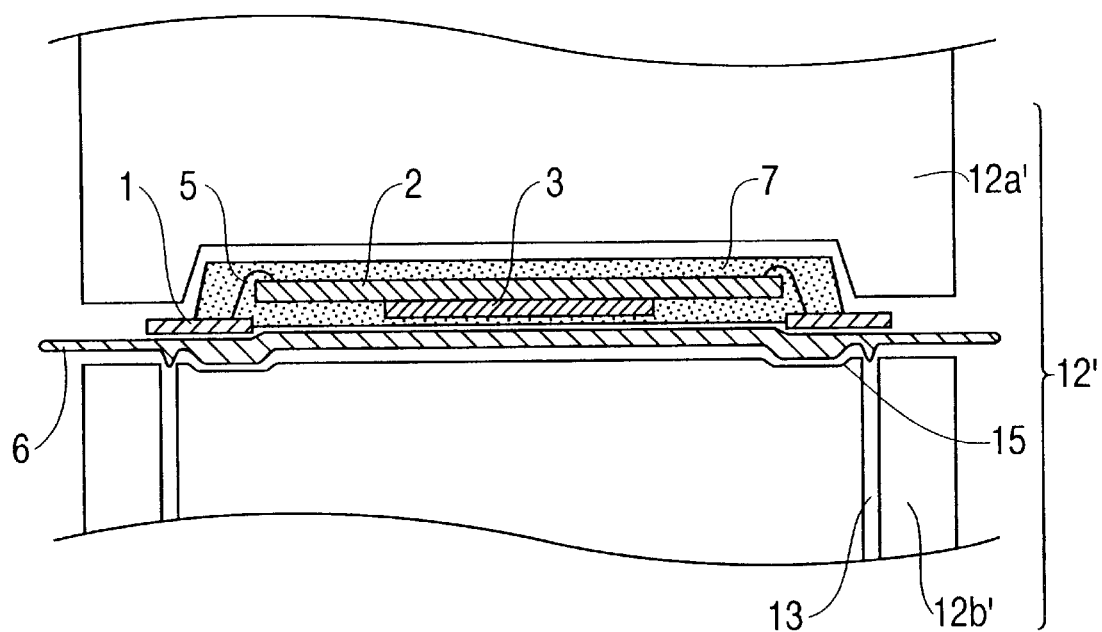
FIG. 2 is a cross-sectional view illustrating a method for manufacturing a resin-molded semiconductor device in the second embodiment of the present invention.
Figure 3:
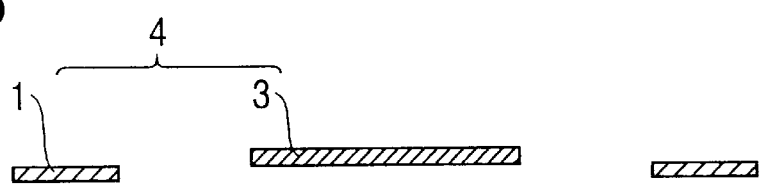
FIG. 3 is a cross-sectional view illustrating a process step of a conventional method for manufacturing a resin-molded semiconductor device.
Figure 4:
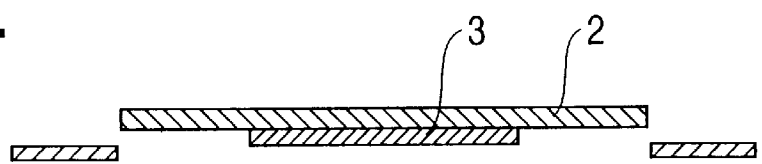
FIG. 4 is a cross-sectional view illustrating another process step of the conventional method for manufacturing a resin-molded semiconductor device.
Figure 5:
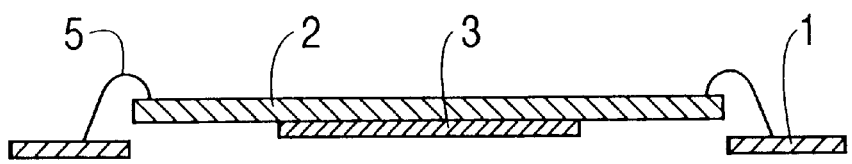
FIG. 5 is a cross-sectional view illustrating still another process step of the conventional method for manufacturing a resin-molded semiconductor device.
Figure 6:
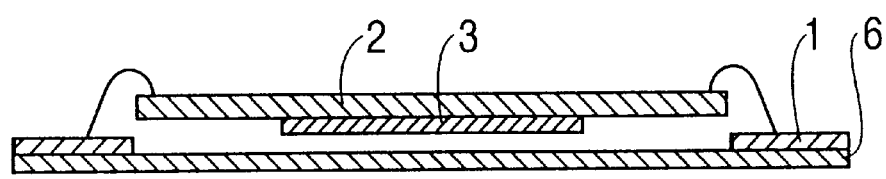
FIG. 6 is a cross-sectional view illustrating still another process step of the conventional method for manufacturing a resin-molded semiconductor device.
Figure 7:
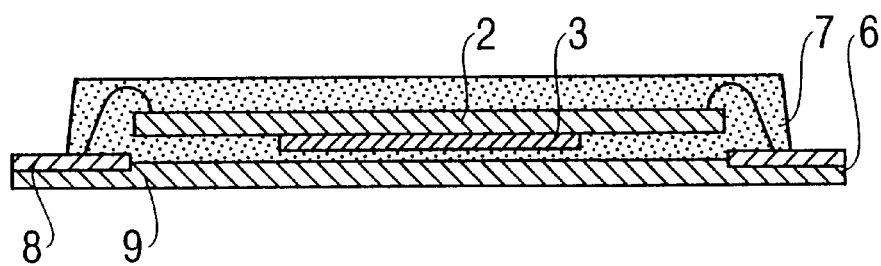
FIG. 7 is a cross-sectional view illustrating still another process step of the conventional method for manufacturing a resin-molded semiconductor device.
Figure 8:
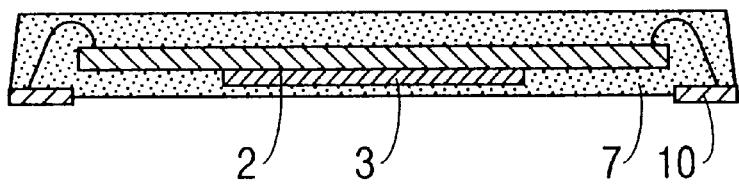
FIG. 8 is a cross-sectional view illustrating still another process step of the conventional method for manufacturing a resin-molded semiconductor device.
Figure 9:
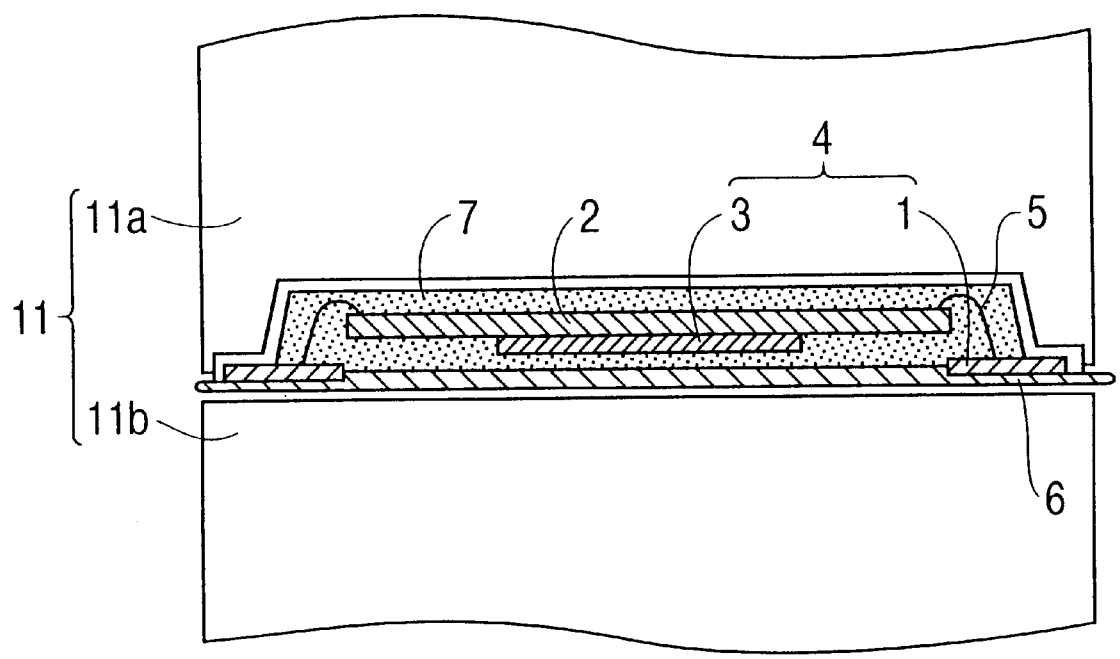
FIG. 9 is a cross-sectional view illustrating a molding die used in the conventional method for manufacturing a resin-molded semiconductor device.

Hereinafter, preferred embodiments of the present invention will be described with reference to the accompanying drawings, in which the same reference numerals denote the same components throughout the following embodiments.

EMBODIMENT 1

FIGS. 1A and 1B illustrate a method for manufacturing a resin-molded semiconductor device in the first embodiment of the present invention. FIG. 1A is a plan view of a molding die (lower mold) used in the method for manufacturing a resin-molded semiconductor device, while FIG. 1B is a cross-sectional view taken along the line 1B—1B of FIG. 1A illustrating how resin molding is realized using the molding die.

As shown in FIG. 1B, a molding die 12, which is preferably used in the method for manufacturing a resin-molded semiconductor device of the first embodiment, includes an upper mold 12a and a lower mold 12b. A lead frame, including an inner lead portion 1, is mounted on the lower mold 12b. A semiconductor chip (such as an IC chip or an LSI chip), mounted on and bonded to a die pad portion 3, is electrically connected to the lead frame via metal fine wires 5. In the case of encapsulating the lead frame with a molding compound (e.g., resin) 7 by pressing the bottom face of the inner lead portion 1 (i.e., the surface on which the sealing sheet 6 is disposed) onto the upper surface of the lower mold 12b, the sealing sheet 6 is caused to stick to the lower mold 12b at four positions and equally applied tension on the surface of the lower mold 12b by four vacuum suction devices (vacuum holes) 13 formed in the lower mold 12b. In this way, it is possible to prevent heat shrinkage or sagging owing to heat from forming wrinkles on the sealing sheet 6 during resin molding. As a result, in the resin-molded semiconductor device, the surface of the molding compound exposed on the reverse surface thereof can be flattened.

This effect is accomplished by the following mechanism. During resin molding, the sealing sheet 6 tries to shrink or expand and sag because of the heat applied. Against this action, tensile strength is applied to the sealing sheet 6 via vacuum formed by the vacuum suction devices 13, thereby suppressing the shrinkage of the sealing sheet 6 and keeping the sealing sheet 6 extended (stretched). As a result, it is possible to prevent wrinkles from being formed on the sealing sheet 6 and it is also possible to flatten the surface of the molding compound 7 in contact with the sealing sheet 6. It is noted that the number of the vacuum suction devices 13 is not limited to four.

Also, the depth and the width of a vacuum groove 14 linking together the vacuum suction devices 13 formed in the lower mold 12b of the molding die 12 are preferably set in view of the extension percentage of the sealing sheet 6. The depth of the groove 14 may be in the range from 0 mm to 5 mm, for example, and the width of the groove 14 may be in the range from 1 mm to 5 mm, for example.

In this embodiment, the same method as that described with reference to FIGS. 3 to 6 is applicable for bonding and wire-bonding the semiconductor chip to the lead frame.

The sealing sheet is made of a fluoroplastic, for example, and the thickness thereof may be in the in the range from 10 $\mu$m to 80 $\mu$m.

As described above, the first embodiment is implemented as a method for manufacturing a resin-molded semiconductor device by interposing a sealing sheet within a molding die for encapsulating a lead frame, on which a semiconductor chip has been bonded, with a molding compound. In adhering the sealing sheet to the lead frame and encapsulating the lead frame with the molding compound, the sealing sheet is caused to stick to the molding die by a plurality of vacuum suction devices, which are formed in the molding die at substantially regular intervals, thereby equally applying tension to the sheet. If the sealing sheet is thin, the formation of wrinkles because of heat shrinkage or sagging owing to heat can be suppressed, and the surface of the molding compound exposed on the reverse surface of the resin-molded semiconductor device can be flattened.

EMBODIMENT 2

Next, a method for manufacturing a resin-molded semiconductor device in the second embodiment of the present invention will be described. FIG. 2 illustrates the method for manufacturing a resin-molded semiconductor device approaching the above-described problems in a different manner than that illustrated in FIGS. 1A and 1B.

As shown in FIG. 2, a molding die 12', which is preferably used in the method for manufacturing a resin-molded semiconductor device of the second embodiment, also includes an upper mold 12a' and a lower mold 12b'. A lead frame, including an inner lead portion 1, is mounted on the lower mold 12b'. A semiconductor chip (such as an IC chip), mounted on and bonded to a die pad portion 3, is electrically connected to the lead frame via metal fine wires 5. Engraved portions 15 are formed as concave portions at desired depths in the respective parts of the lower mold 12b' that come into contact with the inner lead portion 1 of the lead frame. The engraved portions 15 are preferably formed to be located under external electrodes. The lead frame is encapsulated with a molding compound 7 by making the upper mold 12a' press the surface of the sealing sheet 6 in contact with the bottom face of the inner lead portion 1 onto the upper surface of the lower mold 12b'. During this resin molding, if such a mold as having the engraved portions 15 is used as the lower mold 12, then parts of the sealing sheet 6 are allowed to fill in the engraved portions 15. As a result, the area of the side faces of the inner lead portion 1 covered by the sealing sheet 6 forcing its way inward owing to heat shrinkage can be reduced. In other words, the depth of the groove formed around the side faces of the inner lead portion 1 can be reduced. Moreover, the adhesion areas between the side faces of the inner lead portion 1 and the molding compound 7 can be increased and therefore the adhesion strength of the molding compound 7 to the inner lead portion 1 can be increased.

If the thickness of the sealing sheet 6 is in the range from about 30 $\mu$m to about 80 $\mu$m, the difference between the thickness of the sealing sheet 6 and the depth of the engraved portions 15 is preferably about 25 $\mu$m. The width of the engraved portions 15 is set in the range from 0.2 mm to 1 mm, for example.

As described above, the second embodiment is implemented as a method for manufacturing a resin-molded semiconductor device by interposing a sealing sheet within a molding die for encapsulating a lead frame, on which a semiconductor chip has been bonded, with a molding compound. In adhering the sealing sheet to an inner lead portion of the lead frame, a molding die, including concave portions at respective parts that come into contact with the sealing sheet, is used. And in encapsulating the lead frame with the molding compound, parts of the sealing sheet, which come into contact with the inner lead portion, are allowed to fill in the respective concave portions. In the case of using a thick sheet, the surface of the molding compound exposed on the reverse surface of the resin-molded semiconductor device can be naturally flattened. In addition, the depth of the groove formed around the side faces of the inner lead portion can be reduced. As a result, the adhesion areas between the side faces of the inner lead portion and the molding compound can be increased and the adhesion strength of the molding compound to the inner lead portion can be increased.

As can be understood, in accordance with the method for manufacturing a resin-molded semiconductor device of the present invention using a sealing sheet, resin molding is performed either by applying tension to the sheet or by allowing the parts of the sealing sheet in contact with the inner lead portion of the lead frame to fill in the concave portions provided for the molding die. As a result, the surface of the molding compound exposed on the reverse surface of the resin-molded semiconductor device can be flattened, irrespective of the thickness of the sealing sheet. In addition, the depth of the groove formed around the side faces of the inner lead portion, functioning as external electrodes, can be reduced.

As is apparent from the foregoing description, the method for manufacturing a resin-molded semiconductor device of the present invention can attain the following effects by using vacuum suction devices inside the molding die, irrespective of the thickness of the sealing sheet:

(1) Since resin molding is performed while equally applying tension to the sealing sheet, it is possible to prevent wrinkles from being formed on the sealing sheet even when the sealing sheet shrinks or sags because of the heat applied.

(2) By engraving the parts of the molding die that come into contact with the inner lead portion at desired depths, the depth of the groove formed around the side faces of the inner lead portion can be reduced and the adhesion area between the side faces of the inner lead portion and the molding compound can be increased. As a result, the adhesion strength between the inner lead portion and the molding compound can be increased.

What is claimed is:

1. A method for manufacturing a resin-molded semiconductor device by interposing a sealing sheet within a molding die for encapsulating a lead frame, on which a semiconductor chip has been bonded, with a molding compound, wherein in adhering the sealing sheet to the lead frame and encapsulating the lead frame with the molding compound, the sealing sheet is caused to stick to the molding die by a plurality of vacuum suction devices, which are formed in the molding die at substantially regular intervals, thereby equally applying tension to the sheet, and wherein in adhering the sealing sheet to an inner lead portion of the lead frame, a molding die, including concave portions at respective parts that come into contact with the sealing sheet, is used as the molding die, and wherein in encapsulating the lead frame with the molding compound, redundant parts of the sealing sheet, which come into contact with the inner lead portion, are allowed to fill in the respective concave portions.

2. The method for manufacturing a resin-molded semiconductor device of claim 1, wherein the plurality of vacuum suction devices cause the sealing sheet to stick to the molding die at four positions.

* * * * *